(12) United States Patent
Koyama et al.

(10) Patent No.: US 8,363,778 B2
(45) Date of Patent: *Jan. 29, 2013

(54) DRIVER CIRCUIT, DISPLAY DEVICE INCLUDING THE DRIVER CIRCUIT, AND ELECTRONIC APPLIANCE INCLUDING THE DISPLAY DEVICE

(75) Inventors: Jun Koyama, Sagamihara (JP); Hiroyuki Miyake, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/552,986

(22) Filed: Jul. 19, 2012

(65) Prior Publication Data

US 2012/0280725 A1    Nov. 8, 2012

Related U.S. Application Data

(63) Continuation of application No. 12/887,611, filed on Sep. 22, 2010, now Pat. No. 8,243,873.

(30) Foreign Application Priority Data

Sep. 24, 2009   (JP) ................................ 2009-219066

(51) Int. Cl.
   *G11C 19/00*   (2006.01)
(52) U.S. Cl. ................ 377/78; 377/64; 377/79; 326/93; 326/96; 326/98
(58) Field of Classification Search ................ 377/2, 64, 377/77–81; 327/108; 326/82, 83, 95–98
See application file for complete search history.

(56) References Cited

U.S. PATENT DOCUMENTS

| | | | |
|---|---|---|---|
| 5,744,864 | A | 4/1998 | Cillessen et al. |
| 5,847,410 | A | 12/1998 | Nakajima |
| 5,949,397 | A | 9/1999 | Koyama et al. |
| 6,295,047 | B1 | 9/2001 | Koyama et al. |
| 6,476,791 | B2 | 11/2002 | Koyama et al. |
| 6,563,174 | B2 | 5/2003 | Kawasaki et al. |

(Continued)

FOREIGN PATENT DOCUMENTS

| | | |
|---|---|---|
| JP | 60-198861 | 10/1985 |
| JP | 63-034798 | 2/1988 |

(Continued)

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

(Continued)

*Primary Examiner* — Patrick O'Neill
(74) *Attorney, Agent, or Firm* — Eric J. Robinson; Robinson Intellectual Property Law Office, P.C.

(57) ABSTRACT

An object of the present invention is to provide a driver circuit including a normally-on thin film transistor, which driver circuit ensures a small malfunction and highly reliable operation. The driver circuit includes a static shift register including an inverter circuit having a first transistor and a second transistor, and a switch including a third transistor. The first to third transistors each include a semiconductor layer of an oxide semiconductor and are depletion-mode transistors. An amplitude voltage of clock signals for driving the third transistor is higher than a power supply voltage for driving the inverter circuit.

26 Claims, 12 Drawing Sheets

U.S. PATENT DOCUMENTS

| | | |
|---|---|---|
| 6,586,346 B1 | 7/2003 | Yamazaki et al. |
| 6,727,522 B1 | 4/2004 | Kawasaki et al. |
| 6,897,847 B2 | 5/2005 | Koyama et al. |
| 6,928,136 B2 | 8/2005 | Nagao et al. |
| 6,960,812 B2 | 11/2005 | Yamazaki et al. |
| 7,057,598 B2 | 6/2006 | Azami et al. |
| 7,061,014 B2 | 6/2006 | Hosono et al. |
| 7,119,784 B2 | 10/2006 | Koyama et al. |
| 7,202,728 B2 | 4/2007 | Kondo |
| 7,205,610 B2 | 4/2007 | Koyama |
| 7,301,211 B2 | 11/2007 | Yamazaki et al. |
| 7,348,956 B2 | 3/2008 | Koyama et al. |
| 7,674,650 B2 | 3/2010 | Akimoto et al. |
| 7,732,819 B2 | 6/2010 | Akimoto et al. |
| 8,008,950 B2 | 8/2011 | Jinta |
| 8,040,163 B2 | 10/2011 | Jinta |
| 8,243,873 B2 * | 8/2012 | Koyama et al. ............... 377/78 |
| 2003/0189401 A1 | 10/2003 | Kido et al. |
| 2006/0244107 A1 | 11/2006 | Sugihara et al. |
| 2007/0108446 A1 | 5/2007 | Akimoto |
| 2007/0172591 A1 | 7/2007 | Seo et al. |
| 2007/0187760 A1 | 8/2007 | Furuta et al. |
| 2008/0128689 A1 | 6/2008 | Lee et al. |
| 2008/0203387 A1 | 8/2008 | Kang et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2010/0025678 A1 | 2/2010 | Yamazaki et al. |
| 2010/0110623 A1 | 5/2010 | Koyama et al. |
| 2010/0163874 A1 | 7/2010 | Koyama et al. |

FOREIGN PATENT DOCUMENTS

| | | |
|---|---|---|
| JP | 64-089810 | 4/1989 |
| JP | 03-231472 | 10/1991 |
| JP | 05-251705 | 9/1993 |
| JP | 08-264794 | 10/1996 |
| JP | 63-034798 | 2/1998 |
| JP | 11-505377 | 5/1999 |
| JP | 2000-150900 | 5/2000 |
| JP | 2003-086000 | 3/2003 |
| JP | 2003-086808 | 3/2003 |
| JP | 2004-103957 | 4/2004 |
| JP | 2005-235311 A | 9/2005 |
| JP | 2007-096055 | 4/2007 |
| JP | 2007-123861 | 5/2007 |
| JP | 2007-250983 | 9/2007 |
| JP | 2009-188749 | 8/2009 |
| JP | 2009-188867 A | 8/2009 |
| WO | WO 2004/114391 | 12/2004 |
| WO | WO 2007/119386 | 10/2007 |

OTHER PUBLICATIONS

Ikeda et al., "Full-Functional System Liquid Crystal Display using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Takahashi et al., "Theoretical Analysis of IGZO Transparent Amorphous Oxide Semiconductor," IDW '08: Proceedings of the 15$^{th}$ International Display Workshops, Dec. 3, 2008, pp. 1637-1640.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$-$Ga_2ZnO_4$-ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ ($m$=3, 4, and 5), $InGaO_3(ZnO)_3$, and $Ga_2O_3(ZnO)m$ ($m$=7, 8, 9, and 16) in the $In_2O_3$-$ZnGa_2O_4$-ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Li et al., "Modulated Structures of Homologous Compounds $InMO_3(ZnO)_m$ (M=in,Ga; m=Integer) Described by Four-Dimensional Superspace Group," Journal of Solid State Chemistry, 1998, vol. 139, pp. 347-355.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9$^{th}$ International Display Workshops, Dec. 4, 2002, pp. 295-298.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: the "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In-Ga-Zn-Oxide TFTS," IDW '09: Proceedings of the 16$^{th}$ International Display Workshops, 2009, pp. 689-692.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Osada et al., "Development of Driver-Integrated Panel using Amorphous In-Ga-Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Ohara et al., "21.3: 4.0 In. QVGA AMOLED Display Using In-Ga-Zn-Oxide TFTs with a Novel Passivation Layer," SID Digest '09: SID International Symposium Digest of Technical Papers, May 31, 2009, pp. 284-287.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Lee et al., "Current Status of, Challenges to, and Perspective View of AM-OLED," IDW '06: Proceedings of the 13$^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] at Temperatures Over 1000° C." Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

International Search Report (Application No. PCT/JP2010/065089) dated Oct. 19, 2010.

Written Opinion (Application No. PCT/JP2010/065089) dated Oct. 19, 2010.

* cited by examiner

DRIVER CIRCUIT, DISPLAY DEVICE INCLUDING THE DRIVER CIRCUIT, AND ELECTRONIC APPLIANCE INCLUDING THE DISPLAY DEVICE

TECHNICAL FIELD

This invention relates to a driver circuit (also referred to as a shift register circuit), a display device including a driver circuit formed over the same substrate as a pixel area, or an electronic appliance including the display device.

BACKGROUND ART

Along with the widespread use of large display devices such as liquid crystal televisions, higher-value-added products are required and thus development is being carried out. In particular, a technique to form a driver circuit, such as a scan line driver circuit, over the same substrate as a pixel area with the use of a thin film transistor (TFT) having a channel region of an amorphous semiconductor, specifically an oxide semiconductor, is under active development.

Examples of the structure of the driver circuit include a static shift register circuit which is disclosed in Patent Document 1 (see FIG. 2 and the like).

REFERENCE

[Patent Document 1] Japanese Published Patent Application No. S64-89810

DISCLOSURE OF INVENTION

A static shift register circuit includes a thin film transistor which functions as a switch, and an inverter circuit. The use of an oxide semiconductor for a semiconductor layer of transistors serving as the thin film transistor and the inverter circuit offers a substantial merit: good electrical characteristics such as high field-effect mobility. The threshold voltage of an oxide semiconductor, however, fluctuates because of a defect of void by lack of oxygen even without the addition of an extrinsic impurity to the oxide semiconductor and thus the thin film transistor having a semiconductor layer of an oxide semiconductor is depletion mode (also referred to as normally on) in some cases.

In view of this, an object of one embodiment of the present invention is to provide a driver circuit with a small malfunction even when the driver circuit is provided using thin film transistors, all of which are of the same conductivity type and which are normally on because of, for example, their channels including an oxide semiconductor.

One embodiment of the present invention is a driver circuit including a static shift register including an inverter circuit including a first transistor and a second transistor, and a switch including a third transistor. The first to third transistors each include a semiconductor layer including an oxide semiconductor and are depletion-mode transistors. An amplitude voltage of clock signals for driving the third transistor is higher than a power supply voltage for driving the inverter circuit.

One embodiment of the present invention is a driver circuit including a static shift register including an inverter circuit including a first transistor and a second transistor, and a switch including a third transistor; and a demultiplexer circuit connected to an output terminal of the shift register. The first to third transistors each include a semiconductor layer including an oxide semiconductor and are depletion-mode transistors. An amplitude voltage of clock signals for driving the first transistor is higher than a power supply voltage for driving the inverter circuit. Output terminals of the demultiplexer circuit are each connected to a fourth transistor for holding a potential of the output terminal.

One embodiment of the present invention can be a driver circuit in which the clock signals are a first clock signal and a second clock signal, and the second clock signal is an inverted signal of the first clock signal.

One embodiment of the present invention can be a driver circuit in which an L/W ratio of the first transistor is higher than an L/W ratio of the second transistor.

One embodiment of the present invention can be a driver circuit in which a film thickness of a semiconductor layer of the first transistor is larger than a film thickness of a semiconductor layer of the second transistor.

One embodiment of the present invention can be a driver circuit in which an L/W ratio of a fifth transistor in the demultiplexer circuit is lower than an L/W ratio of the fourth transistor.

One embodiment of the present invention can be a driver circuit in which a gate of the fourth transistor is electrically connected to a line through which a positive power supply voltage is supplied; a first terminal of the fourth transistor is electrically connected to a line through which a negative power supply voltage is supplied; and a second terminal of the fourth transistor is electrically connected to an output terminal of the demultiplexer circuit.

One embodiment of the present invention can be a driver circuit in which the first to fourth transistors are n-channel transistors.

One embodiment of the present invention can provide a driver circuit with a small malfunction even when the driver circuit is provided using thin film transistors, all of which are of the same conductivity type and which are normally on because of, for example, their channels including an oxide semiconductor.

BEST MODE FOR CARRYING OUT THE INVENTION

Figure 1A:
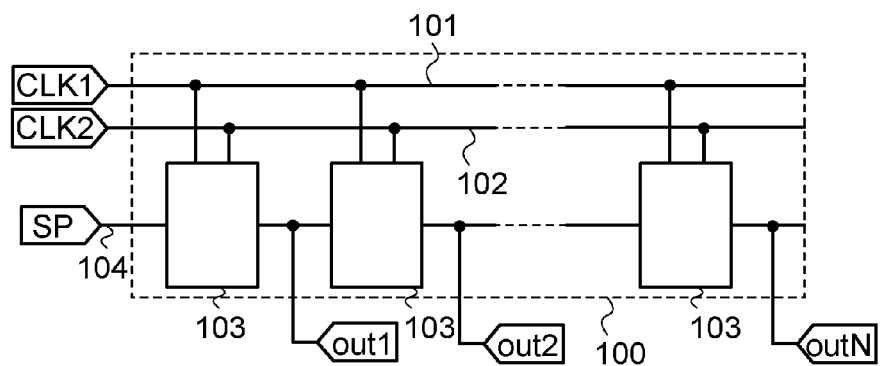
FIGS. 1A and 1B show an example of a driver circuit.

Hereinafter, embodiments of the present invention will be described with reference to the accompanying drawings. However, the present invention can be carried out in many different modes, and it is easily understood by those skilled in the art that modes and details of the present invention can be modified in various ways without departing from the purpose and the scope of the present invention. Therefore, this invention is not interpreted as being limited to the description of the embodiments below. Note that identical portions or portions having the same function in all drawings illustrating the structure of the invention that are described below are denoted by the same reference numerals.

Note that the size, the thickness of a layer, or a region of each structure illustrated in drawings or the like of embodiments is exaggerated for simplicity in some cases. Therefore, embodiments of the present invention are not limited to such scales.

Note that terms such as first, second, third to Nth (N is a natural number of two or more) employed in this specification are used in order to avoid confusion between components and do not set a limitation on number.

Embodiment 1

In this embodiment, first, the structure of a driver circuit which is a static shift register circuit including pulse output circuits of a plurality of stages will be described with reference to drawings. A driver circuit according to this embodiment is formed using a thin film transistor serving as a switch, and an inverter circuit.

A driver circuit 100 in this embodiment includes a line 101 through which a first clock signal (CLK1) is supplied, a line 102 through which a second clock signal (CLK2) is supplied, pulse output circuits 103 of a plurality of stages, and a line 104 through which a start pulse (also referred to as SP, a signal from the previous stage, or an input signal) is supplied. In addition, the driver circuit according to this embodiment outputs pulse signals out1 to outN. Note that a structure is also acceptable in which a scan direction switching signal, which shifts a scan direction, or the like is input. In addition, although this embodiment shows an example in which the driver circuit is driven by a two-phase clock signal including a first clock signal (CLK1) and a second clock signal (CLK2), it is also acceptable that the driver circuit is driven by a clock signal other than a two-phase clock signal.

If the driver circuit in FIG. 1A is a driver circuit which drives gate lines, a buffer circuit or the like is connected to each output terminal of a pulse output circuit. Alternatively, if the driver circuit in FIG. 1A is a driver circuit which drives signal lines, a sampling switch which samples an image signal, a latch circuit, or the like is connected to each output terminal of a pulse output circuit.

Note that an oxide semiconductor is preferably used for the semiconductor layer of each transistor in the driver circuit 100. The use of an oxide semiconductor for the semiconductor layer of a transistor provides higher field-effect mobility than that of a silicon-base semiconductor material such as amorphous silicon. Note that the oxide semiconductor can be zinc oxide (ZnO), tin oxide ($SnO_2$), or the like. In addition, In or Ga can be added to ZnO.

The oxide semiconductor can use a thin film expressed by $1 nMO_3(ZnO)_x$ (x>0). Note that M denotes one or more of the metal elements selected from gallium (Ga), iron (Fe), nickel (Ni), manganese (Mn), and cobalt (Co). For example, M denotes Ga in some cases and M denotes the above metal element such as Ni or Fe in addition to Ga (Ga and Ni or Ga and Fe) in other cases. Moreover, the above oxide semiconductor may contain Fe or Ni, another transitional metal element, or an oxide of the transitional metal as an impurity element in addition to the metal element contained as M. For example, the oxide semiconductor can use an In—Ga—Zn—O-based non-single-crystal film.

Instead of the oxide semiconductor layer ($1 nMP_3(ZnO)_x$ (x>0) film) which is the In—Ga—Zn—O-based non-single-crystal film, an $1 nMP_3(ZnO)_x$ (x>0) film in which M is another metal element can be used. In addition, the oxide semiconductor can use, in addition to the above, any of the following oxide semiconductors: an In—Sn—Zn—O-based oxide semiconductor; an In—Al—Zn—O-based oxide semiconductor; a Sn—Ga—Zn—O-based oxide semiconductor; an Al—Ga—Zn—O-based oxide semiconductor; a Sn—Al—Zn—O-based oxide semiconductor; an In—Zn—O-based oxide semiconductor; a Sn—Zn—O-based oxide semiconductor; an Al—Zn—O-based oxide semiconductor; an In—O-based oxide semiconductor; a Sn—O-based oxide semiconductor; and a Zn—O-based oxide semiconductor.

Note that a thin film transistor is an element having at least three terminals: a gate terminal, a drain terminal, and a source terminal, and has a channel region between a drain region and a source region. Current can be fed through the drain region, the channel region, and the source region. In this specification, a terminal connected to a line through which a positive power supply voltage Vdd is supplied is a drain terminal, and a terminal connected to a line through which a negative power supply voltage Vss is supplied is a source terminal. Note that a source terminal and a drain terminal are referred to as a first terminal and a second terminal in some cases.

Note that the structure of a thin film transistor can employ various modes without being limited to a specific stricture. For example, the structure of a thin film transistor can employ a multi-gate structure having two or more gate electrodes.

Moreover, the structure of a thin film transistor can employ a structure where gate electrodes are formed above and below a channel region. Note that the structure where gate electrodes are formed above and below a channel region can lead to a structure where a plurality of thin film transistors is connected in parallel.

Note that an explicit description "A is connected to B," indicates cases including the case where A is electrically connected to B, the case where A is functionally connected to B, and the case where A is directly connected to B. Here, A and B each denote an object (e.g., a device, an element, a circuit, a line, an electrode, a terminal, a conductive film, or a layer). Therefore, the meaning of such a description is not limited to a predetermined connection relation, e.g. connection relation shown in a drawing or text; the meaning of such a description includes connection relation other than connection relation shown in a drawing or text.

Figure 1B:
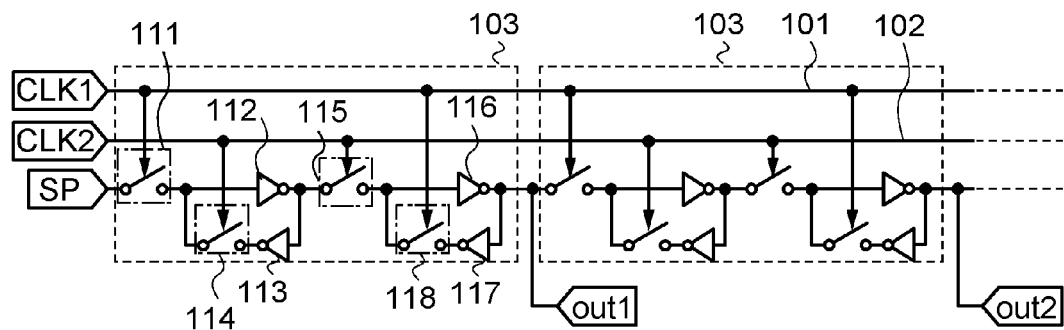

Next, the structure of a pulse output circuit 103 will be described with reference to FIG. 1B. A pulse output circuit 103 includes, for example, a first switch 111 connected to a terminal to which the start pulse SP is input, a first inverter circuit 112 which inverts and outputs a signal which is input to the first inverter circuit 112 through the first switch 111, a second inverter circuit 113 which inverts and outputs the signal inverted by the first inverter circuit 112, a second switch 114 connected to a terminal to which the signal inverted by the second inverter circuit 113 is input, a third switch 115 connected a terminal from which the signal inverted by the first inverter circuit 112 is output, a third inverter circuit 116 which inverts and outputs the signal which is input to the third inverter circuit 116 through the third switch 115, a fourth inverter circuit 117 which inverts and outputs the signal inverted by the third inverter circuit 116, and a fourth switch 118 connected to a terminal to which the signal inverted by the fourth inverter circuit 117 is input. In the circuit diagram shown in FIG. 1B, a block indicated by a dotted line corresponds to a pulse output circuit 103 that outputs a pulse signal from single stage. The shift register in FIG. 1A includes pulse output circuits of N-stages (N is a natural number of two or more). The pulse output circuits of N-stages output the output signals out1 to outN through output terminals of their third inverter circuits 116.

Note that the first switch 111 and the fourth switch 118 described above are connected to the line 101 so that their on (conducting state) or off (non-conducting state) is controlled by the first clock signal CLK1, and the second switch 114 and the third switch 115 are connected to the line 102 so that their on or off is controlled by the second clock signal CLK2.

Figure 2A:
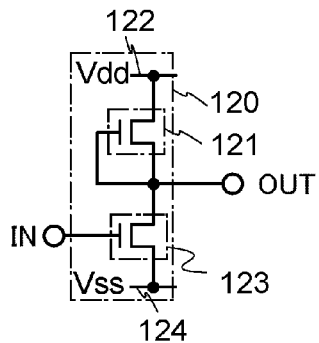
FIGS. 2A and 2B show an inverter circuit.
Figure 2B:
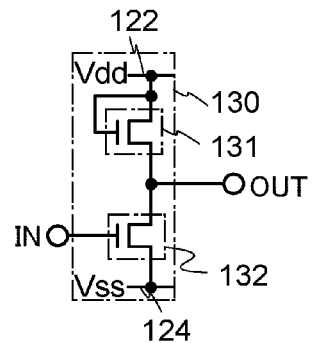

Next, an example of the circuit configuration of the first to fourth inverter circuits 112 to 117 shown in FIG. 1B will be described with reference to FIGS. 2A to 2E. The inverter circuits are each formed using thin film transistors, all of which are of the same conductivity type as shown in FIGS. 2A and 2B because semiconductor layers of the thin film transistors are made of an oxide semiconductor. An inverter circuit 120 in FIG. 2A includes a first transistor 121 and a second transistor 123. A first terminal (a drain terminal here) of the first transistor 121 is connected to a line 122 through which the positive power supply voltage Vdd is supplied, a second terminal (a source terminal here) of the first transistor 121 is connected to a gate of the first transistor 121, and the second terminal of the first transistor 121 is an output terminal of the inverter circuit 120. A first terminal (a drain terminal here) of the second transistor 123 is connected to the second terminal and a gate of the first transistor 121, a second terminal (a source terminal here) of the second transistor 123 is connected to a line 124 through which the negative power supply voltage Vss is supplied, and a gate of the second transistor 123 is an input terminal of the inverter circuit 120.

In addition, an inverter circuit having a different structure from in FIG. 2A is shown in FIG. 2B. An inverter circuit 130 in FIG. 2B includes a first transistor 131 and a second transistor 132. A first terminal (a drain terminal here) of the first transistor 131 is connected to a line 122 through which the positive power supply voltage Vdd is supplied and to a gate of the first transistor 131, and a second terminal (a source terminal here) of the first transistor 131 is an output terminal of the inverter circuit 130. A first terminal (a drain terminal here) of the second transistor 132 is connected to a second terminal of the first transistor 131, a second terminal (a source terminal here) of the second transistor 132 is connected to a line 124 through which the negative power supply voltage Vss is supplied, and a gate of the second transistor 132 is an input terminal of the inverter circuit 130.

Note that a positive power supply voltage is a higher than a reference potential, and a negative power supply voltage is lower than a reference potential. Note that preferably, both a positive power supply voltage and a negative power supply voltage is such that a transistor operates, i.e. a supply of a positive power supply voltage to a gate allows a desired transistor (whose threshold voltage is 0 V) to be turned on, and a supply of a negative power supply voltage to a gate allows a desired transistor to be turned off.

Note that a voltage means a potential difference between a potential and a reference potential in many cases. Therefore, a voltage, a potential and a potential difference can be referred to as a potential, a voltage, and a voltage difference, respectively.

Figure 2C:
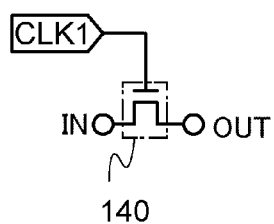
FIG. 2C shows a switch, and FIGS. 2D and 2E each show an example of the waveform of signals.

Next, an example of the circuit configuration of the first to fourth switches 111 to 118 in FIG. 1B will be described. The switches are each formed using a transistor 140 (also referred to as a third transistor) which has a semiconductor layer of an oxide semiconductor, as shown in FIG. 2C. A first terminal (one of a source terminal and drain terminal) of the transistor 140 shown in FIG. 2C which functions as a switch is an input terminal IN of the switch, a second terminal (the other one of the source terminal and drain terminal) of the transistor 140 is an output terminal OUT of the switch, and a gate of the transistor 140 is supplied with the first clock signal CLK1 or the second clock signal CLK2 (FIG. 2C shows the first clock signal CLK1 as an example) from the line 101 or the line 102, which controls on or off of the transistor.

Figure 2D:
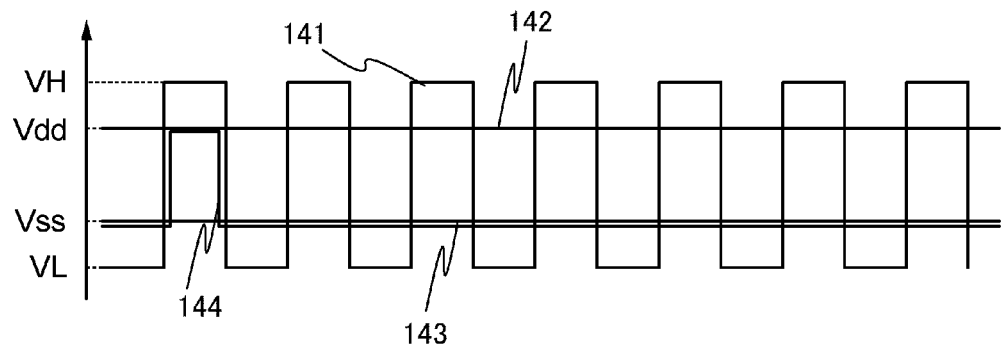

Next, a schematic view of the voltage amplitude of the positive power supply voltage Vdd, the negative power supply voltage Vss, and the first clock signal CLK1 which are input to each circuit shown in FIGS. 2A to 2C is shown in FIG. 2D. In FIG. 2D, the vertical axis denotes the potential, a wave form 141 denotes the first clock signal CLK1, a wave form 142 denotes the positive power supply voltage Vdd, a wave form 143 denotes the negative power supply voltage Vss, and a wave form 144 denotes the start pulse SP.

Figure 2E:
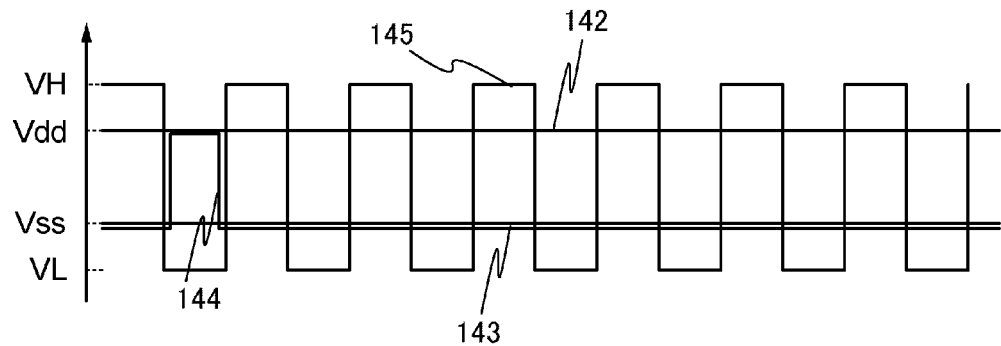

FIG. 2E shows the voltage amplitude of the second clock signal CLK2 instead of the voltage amplitude of the first clock signal CLK1. In FIG. 2E, as in FIG. 2D, the vertical axis denotes the potential, a wave form 145 denotes the second clock signal CLK2, the wave form 142 denotes the positive power supply voltage Vdd, the wave form 143 denotes the negative power supply voltage Vss, and the wave form 144 denotes the start pulse SP. Note that the second clock signal CLK2 is an inverted signal of the first clock signal CLK1.

The voltage amplitude of the first clock signal CLK1 and the second clock signal CLK2 ranges from a high level signal VH to a low level signal VL as shown in FIGS. 2D and 2E. In addition, the potential of the positive power supply voltage Vdd, the potential of the negative power supply voltage Vss, and the voltage amplitude of the start pulse SP ranges from Vss, which is higher than the low level signal VL, to Vdd, which is lower than the high level signal VH.

If the first to fourth inverter circuits 112 to 117, which have a semiconductor layer of an oxide semiconductor, have normally-on transistors, flow-through current is increased, which leads to an increase in the power consumption. Therefore, the power consumption can be reduced by setting the amplitude voltage of the positive power supply voltage Vdd, the negative power supply voltage Vss, and the start pulse SP low in advance. In addition, the first to fourth switches 111 to 118 needs to reliably hold an on state or off state in order to prevent malfunction of a driver circuit. The voltage amplitude of the first clock signal CLK and second clock signal CLK2 is thus set higher than that of the power supply voltage of the inverter circuit, allowing the first to fourth switches 111 to 118 to hold an on state or off state more reliably.

Note that in the case where the first transistor 121 and the second transistor 123 included in the first to fourth inverter circuits 112 to 117 shown in FIG. 2A are normally on, the power consumption is increased even if the voltage of a power supply voltage supplied to the line 122 and the line 124 is lowered. Thus, when an inverter circuit is formed using a transistor which has a semiconductor layer of an oxide semiconductor, the resistance of the second transistor 123 is preferably higher than that of the first transistor 121, i.e. the L/W ratio of the second transistor 123 is preferably higher than that of the first transistor 121.

Figure 3:
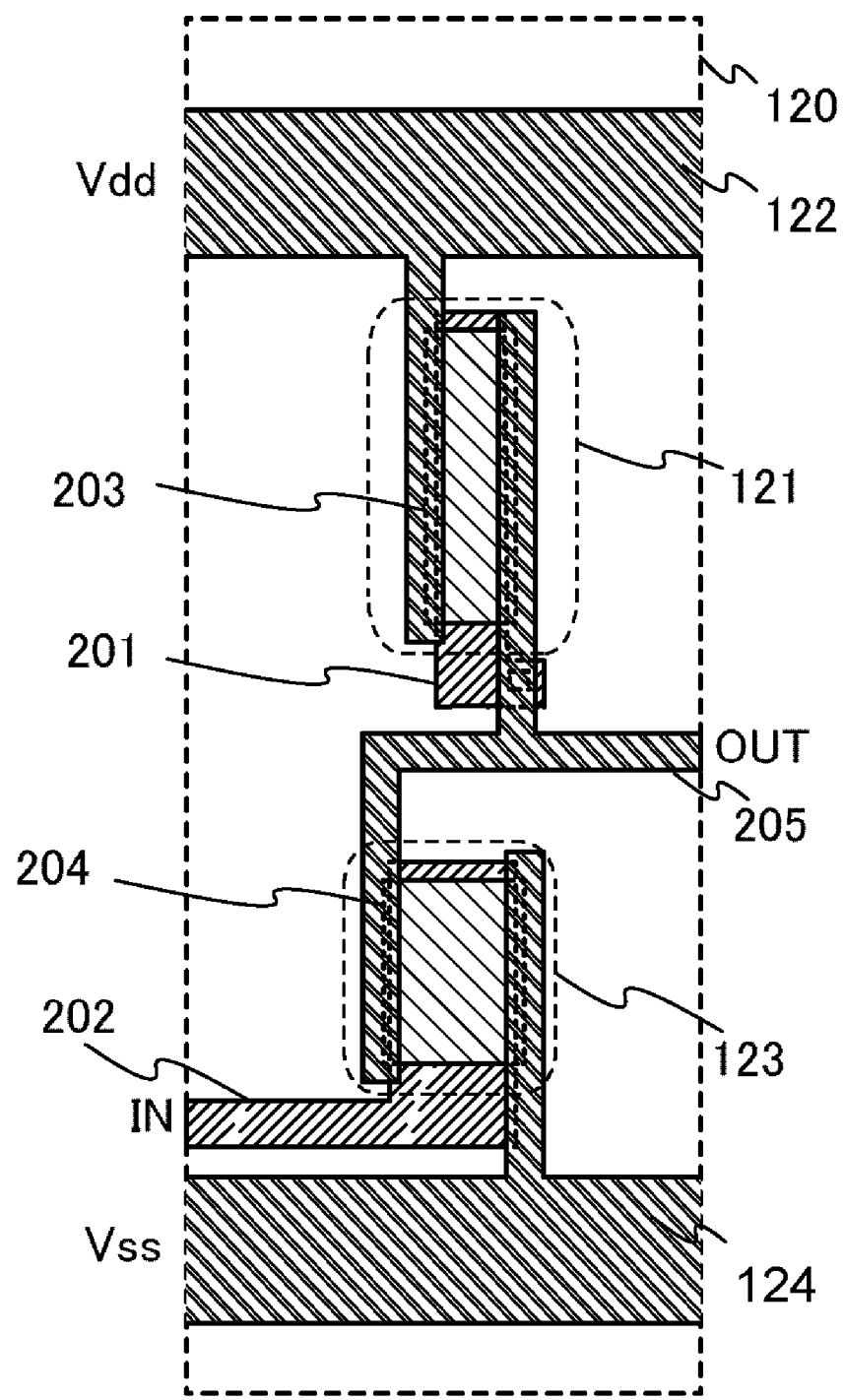
FIG. 3 shows an example of the top view of the inverter circuit.

A top view of the inverter circuit 120 in which the L/W ratio of the second transistor 123 is higher than that of the first transistor 121 is shown in FIG. 3 for specific description. In the inverter circuit 120 shown in FIG. 3, the line 122 through which the positive power supply voltage Vdd is supplied, the line 124 through which the negative power supply voltage Vss is supplied, the first transistor 121, the second transistor 123, a gate line 201 of the first transistor 121, a gate line 202 of the second transistor 123, a semiconductor layer 203 of the first transistor 121, a semiconductor layer 204 of the second transistor 123, and a line 205 which is the source terminal of the first transistor 121 and the drain terminal of the second transistor 123 are shown. Connections of the lines is the same as in FIG. 2A. For example, the gate line 201 and the line 205 are connected to each other through a contact hole. Note that the gate line 202 is an input terminal IN of the inverter circuit 120, and the line 205 is an output terminal of the inverter circuit 120.

Note that the film thickness of the semiconductor layer of the second transistor 123 can be smaller than that of the semiconductor layer of the first transistor 121. This configuration is preferable because it can differentiate the above mentioned resistance. Note that a gate length L is a length of a portion between a source and a drain which portion is in a region where a gate and semiconductor layer of a transistor overlap with each other; and a gate width W is a width of a portion between a source and a drain which portion is in a region where a gate and semiconductor layer of a transistor overlap with each other. Thus, an L/W ratio is a ratio of a gate length to a gate width.

Note that although in this embodiment an example of the thin film transistor which has a semiconductor layer of an oxide semiconductor is described, the configuration disclosed in this embodiment allows a thin film transistor in a driver circuit to operate even when the thin film transistor is normally on. Therefore, the configuration can be applied to, for example, a transistor which is normally on because an impurity giving n-type conductivity is intentionally or unintentionally added to its semiconductor layer of amorphous silicon. Moreover, the configuration can be applied to a transistor which is normally-on because of a parasitic channel formed by accumulation of charge that occurs in the opposite side of a semiconductor layer, which forms a channel region, from a gate insulating film (on the back channel side).

The configuration of this embodiment can control on or off of a transistor in a driver circuit, all of the transistors of which are of the same conductivity type, even when the transistor is normally on. Therefore, a driver circuit with higher accuracy and a small malfunction can be provided despite the normally-on transistor in the driver circuit.

This embodiment can be implemented in appropriate combination with the structures described in the other embodiments.

Embodiment 2

In this embodiment, in addition to the configuration of the driver circuit described above, the configuration of the driver circuit which has a pulse output circuit whose output terminals are each connected to a demultiplexer circuit will be described with reference to drawings. Adding a component described in this embodiment to a driver circuit including an inverter circuit and a thin film transistor serving as a switch which are the components of the driver circuit according to Embodiment 1, is preferable because it can further reduce the power consumption.

Figure 4:
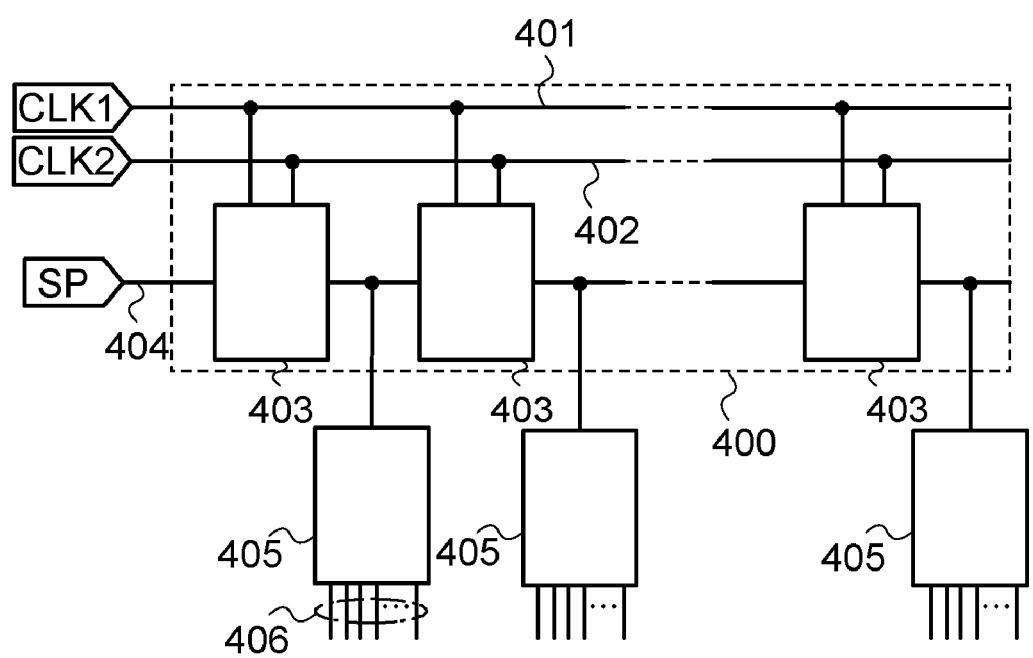
FIG. 4 shows an example of a driver circuit.

A driver circuit 400 according to this embodiment shown in FIG. 4 includes a line 401 through which the first clock signal (CLK1) is supplied, a line 402 through which the second clock signal (CLK2) is supplied, pulse output circuits 403 of a plurality of stages, and a line 404 through which the start pulse (also referred to as SP or input signal) is supplied. The driver circuit according to this embodiment has output terminals, which output pulse signals out1 to outN, each connected to a demultiplexer circuit 405. The demultiplexer circuit 405 generates M (a natural number of two or more) signals rising at different timings, and outputs pulse signals of N×M through lines 406 which are the output terminals of the demultiplexer circuit 405.

In other words, the number of the stages of the pulse output circuit described in Embodiment 1 can be reduced to N/M. This results in a reduction in the frequency of clock signals for driving the driver circuit. Therefore, significant reduction in power consumption can be achieved even with a normally-on transistor.

The demultiplexer circuit 405 is a circuit which generates a plurality of pulse signals each formed of a high-level signal VH and a low-level signal VL passing through the lines 406, by ORing each of the output signals out1 to outN of the static shift register and a control signal of the demultiplexer circuit together. By the demultiplexer circuit 405, the lines are made to be short circuited to a line through which a high-level signal is supplied, short circuited to a line through which a low-level signal is supplied, or electrically floating. This provides a circuit with a small malfunction even if transistors in the demultiplexer circuit 405 are also normally on.

The configuration of the demultiplexer circuit will be specifically described with reference to FIG. 5. Note that the demultiplexer circuit 405 shown in FIG. 5 generates a plurality of signals rising at different timings (four signals here) by using single input signal and a plurality of control signals.

A specific example of the demultiplexer circuit 405 includes a first transistor 501, a second transistor 502, a third transistor 503, a fourth transistor 504, a fifth transistor 505, a sixth transistor 506, a seventh transistor 507, an eighth transistor 508, a ninth transistor 509, a tenth transistor 510, an eleventh transistor 511, a twelfth transistor 512, a thirteenth transistor 513, a fourteenth transistor 514, a line 515 and a line 517 through which a high-level signal is supplied, and a line 516 and a line 518 through which a low-level signal is supplied. On or off of the third transistor 503 is controlled by the application of a first control signal MUX1 to the gate of the third transistor 503. On or off of the fourth transistor 504 is controlled by the application of a second control signal MUX2 to the gate of the fourth transistor 504. On or off of the fifth transistor 505 is controlled by the application of a third control signal MUX3 to the gate of the fifth transistor 505. On or off of the sixth transistor 506 is controlled by the application of a fourth control signal MUX4 to the gate of the sixth transistor 506. On or off of the seventh transistor 507 is controlled by the application of a first inversion control signal MUX1B to the gate of the seventh transistor 507. On or off of the eighth transistor 508 is controlled by the application of a second inversion control signal MUX2B to the gate of the eighth transistor 508. On or off of the ninth transistor 509 is controlled by the application of a third inversion control signal MUX3B to the gate of the ninth transistor 509. On or off of the tenth transistor 510 is controlled by the application of a fourth inversion control signal MUX4B to the gate of the tenth transistor 510. A first terminal of the first transistor 501 is connected to the line 515, and a gate of the first transistor 501 is connected to an output terminal of the driver circuit 400. A first terminal of the second transistor 502 is connected to the line 516, and a gate of the second transistor 502 is connected to an output terminal of the driver circuit 400 as the first transistor 501. A first terminal of the third transistor 503 is connected to the second terminal of the first transistor 501, and a second terminal of the third transistor 503 is connected to a line G1. A first terminal of the fourth transistor 504 is connected to the second terminal of the first transistor 501, and a second terminal of the fourth transistor 504 is connected to a line G2. A first terminal of the fifth transistor 505 is connected to the second terminal of the first transistor 501, and a second terminal of the fifth transistor 505 is connected to a line G3. A first terminal of the sixth transistor 506 is connected to the second terminal of the first transistor 501, and a second terminal of the sixth transistor 506 is connected to a line G4. A first terminal of the seventh transistor 507 is connected to the second terminal of the second transistor 502, and a second terminal of the seventh transistor 507 is connected to the line G1. A first terminal of the eighth transistor 508 is connected to the second terminal of the second transistor 502, and a second terminal of the eighth transistor 508 is connected to the line G2. A first terminal of the ninth transistor 509 is connected to the second terminal of the second transistor 502, and a second terminal of the ninth transistor 509 is connected to the line G3. A first terminal of the tenth transistor 510 is connected to the second terminal of the second transistor 502, and a second terminal of the tenth transistor 510 is connected to the line G4. A first terminal of the eleventh transistor 511 is connected to the line G1, a gate of the eleventh transistor 511 is connected to a line 517, and a second terminal of the eleventh transistor 511 is connected to a line 518. A first terminal of the twelfth transistor 512 is connected to the line G2, a gate of the twelfth transistor 512 is connected to the line 517, and a second terminal of the twelfth transistor 512 is connected to the line 518. A first terminal of the thirteenth transistor 513 is connected to the line G3, a gate of the thirteenth transistor 513 is connected to the line 517, and a second terminal of the thirteenth transistor 513 is connected to the line 518. A first terminal of the fourteenth transistor 514 is connected to the line G4, a gate of the fourteenth transistor 514 is connected to the line 517, and a second terminal of the fourteenth transistor 514 is connected to the line 518.

Figure 5:
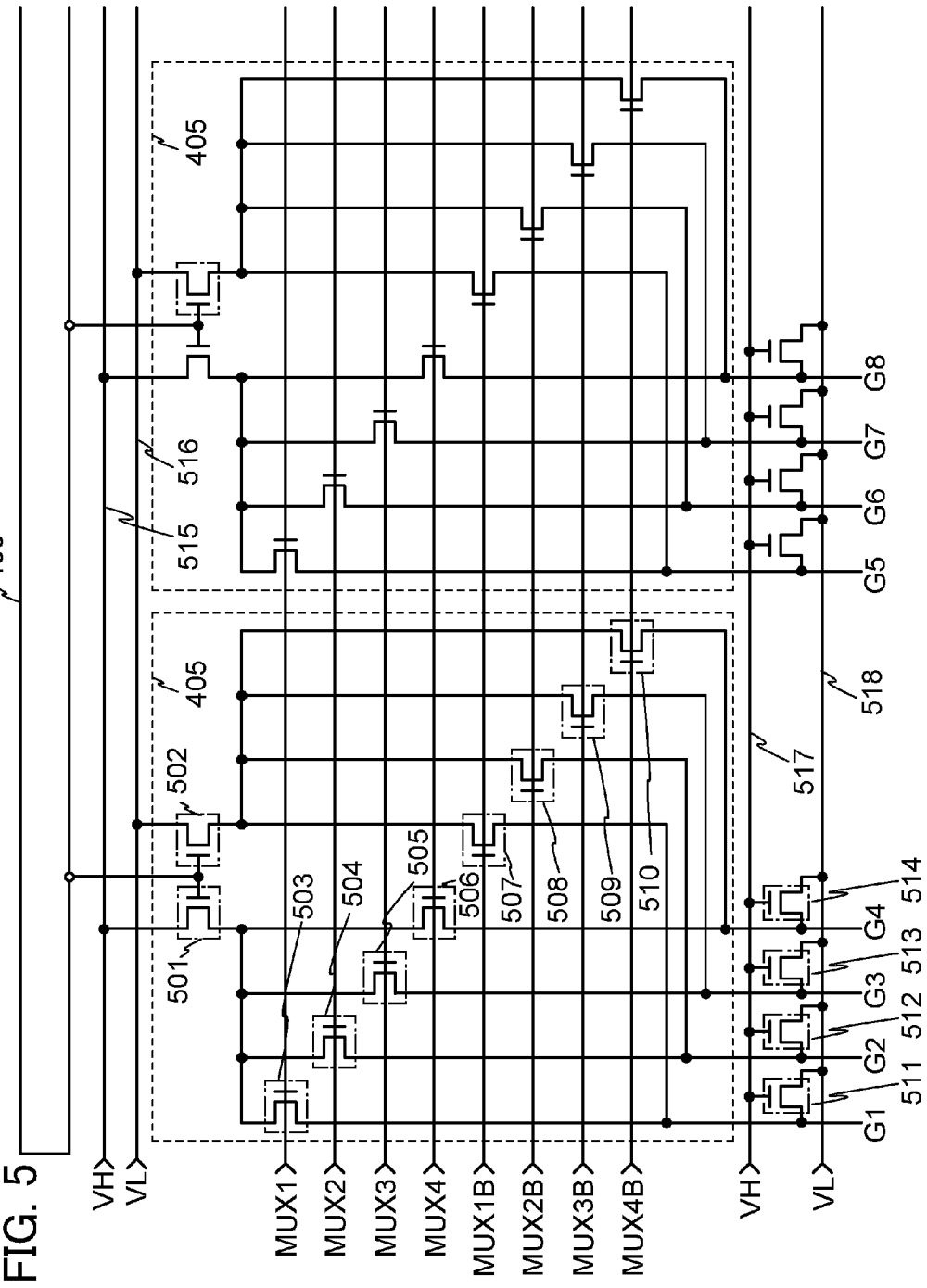
FIG. 5 shows an example of the driver circuit.

Note that in the demultiplexer circuit 405 shown in FIG. 5, the first to tenth transistors 501 to 510 are designed to have lower L/W ratio than the eleventh to fourteenth transistors 511 to 514. In other words, the first to tenth transistors 501 to 510 are designed to have higher current supply capability than the eleventh to fourteenth transistors 511 to 514.

Specifically, in the case where a demultiplexer circuit is configured using transistors which have a semiconductor layer of an oxide semiconductor, the eleventh to fourteenth transistors 511 to 514 are preferably designed to have higher capacitance than the first to tenth transistors 501 to 510. In other words, the eleventh to fourteenth transistors 511 to 514 are preferably designed to have higher L/W ratio than the first to tenth transistors 501 to 510. Note that the eleventh to fourteenth transistors 511 to 514 can have a semiconductor layer, a thickness of which is smaller than that of the first to tenth transistors 501 to 510. This configuration is preferable because it can differentiate the above mentioned capacitance.

In FIG. 5, when the lines G1 to G4 have the high-level signal VH given by the first to tenth transistors 501 to 510, the lines G1 to G4 have the high-level signal VH since the first to tenth transistors 501 to 510 have higher current supply capability than the eleventh to fourteenth transistors 511 to 514. Further, in a period where the lines G1 to G4 are floating, the high-level signal VH is supplied to the gate of the eleventh to fourteenth transistors 511 to 514, whereby the eleventh to fourteenth transistors 511 to 514 can make the lines G1 to G4 maintain the low-level signal VL. In other words, the eleventh to fourteenth transistors 511 to 514 have a function of holding the potential of the low-level signal except when the lines G1 to G4 have the potential of the high-level signal VH. Note that the eleventh to fourteenth transistors 511 to 514 are each called a fourth transistor in some cases, according to the first transistor and the second transistor which are included in an inverter circuit of the driver circuit 400, and the third transistor which is a switch of the driver circuit 400. In addition, the first to tenth transistors 501 to 510 are each called a fifth transistor in some cases, according to the first transistor and the second transistor which are included in an inverter circuit of the driver circuit 400, the third transistor which is a switch of the driver circuit 400, and the fourth transistor.

As described above, if the transistors included in the demultiplexer circuit 405 are also normally on, it is possible that the potential of the low-level signal VL may be not held because of a leakage current or the like which occurs in a period where the lines are floating. The circuit configuration shown in FIG. 5 allows the potential of the low-level signal VL to be held even when a leakage current occurs in the lines G1 to G4, whereby a malfunction can be small.

Next, the operation shown in FIG. 5 will be described with reference to a timing chart in FIG. 6. Signals shown in FIG. 6 are the first clock signal CLK1 and the second clock signal CLK2 which are supplied to the driver circuit 400; the output signal out1, the output signal out2, the output signal out3, and the output signal out4 which are output from the driver circuit 400; the first control signal MUX1, the second control signal MUX2, the third control signal MUX3, the fourth control signal MUX4, the first inversion control signal MUX1B, the second inversion control signal MUX2B, the third inversion control signal MUX3B, the fourth inversion control signal MUX4B, which are shown in FIG. 5; and output signals GOUT1, GOUT2, and GOUT3 which are output from the demultiplexer circuit 405.

Figure 6:
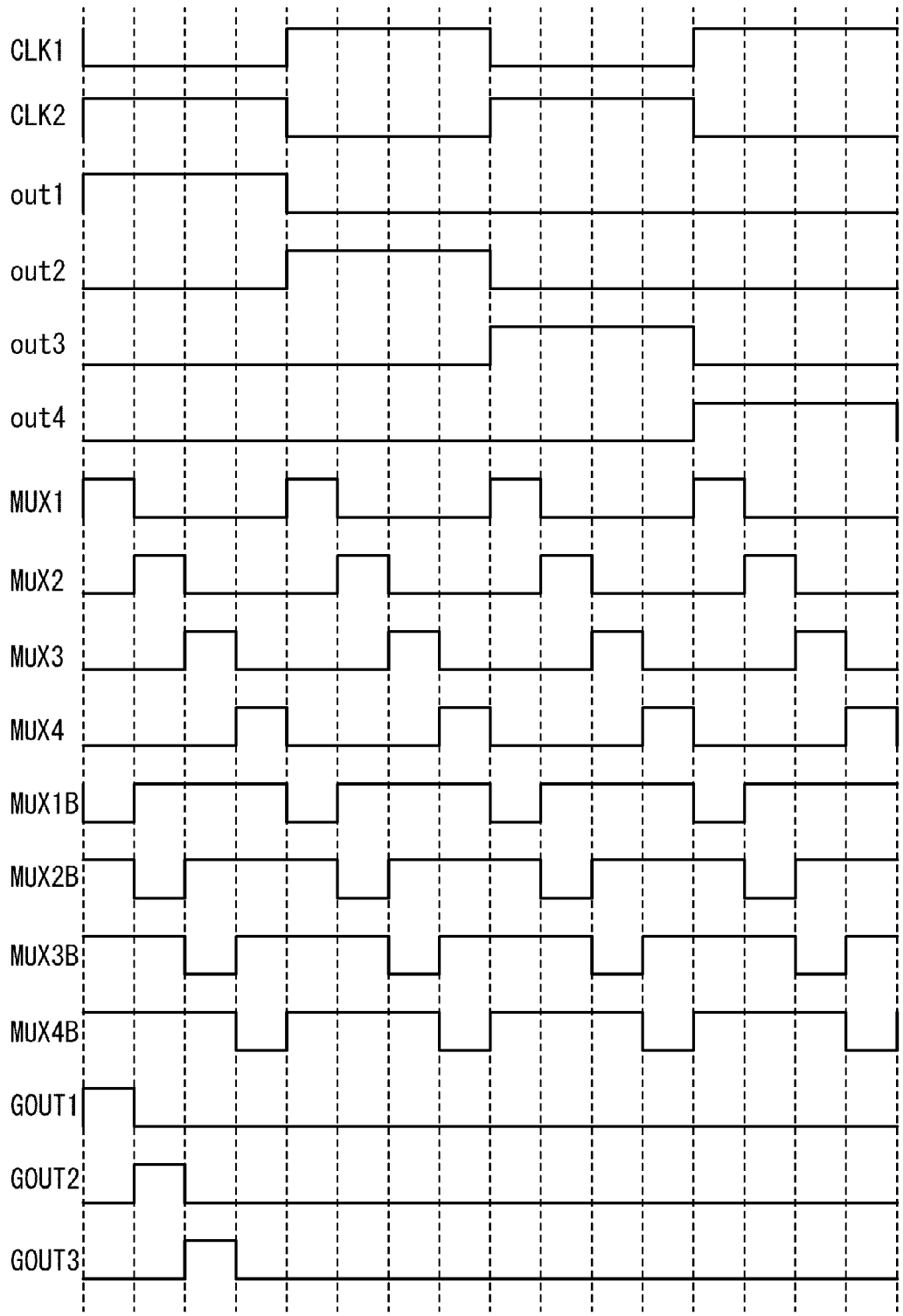
FIG. 6 shows an example of the timing chart of the driver circuit.

The output signals out1 to out4 are sequentially output as pulse signals in response to the first clock signal CLK1 and the second clock signal CLK2 as shown in FIG. 6. The pulse signal of out1 is ORed with the first control signal MUX1, the second control signal MUX2, the third control signal MUX3, or the fourth control signal MUX4, so that the signals GOUT1, GOUT2, and GOUT3 are output through the lines G1 to G3. Note that the first inversion control signal MUX1B, the second inversion control signal MUX2B, the third inversion control signal MUX3B, and the fourth inversion control signal MUX4B are in opposite phase to the first control signal MUX1, the second control signal MUX2, the third control signal MUX3, and the fourth control signal MUX4, respectively.

Figure 11:
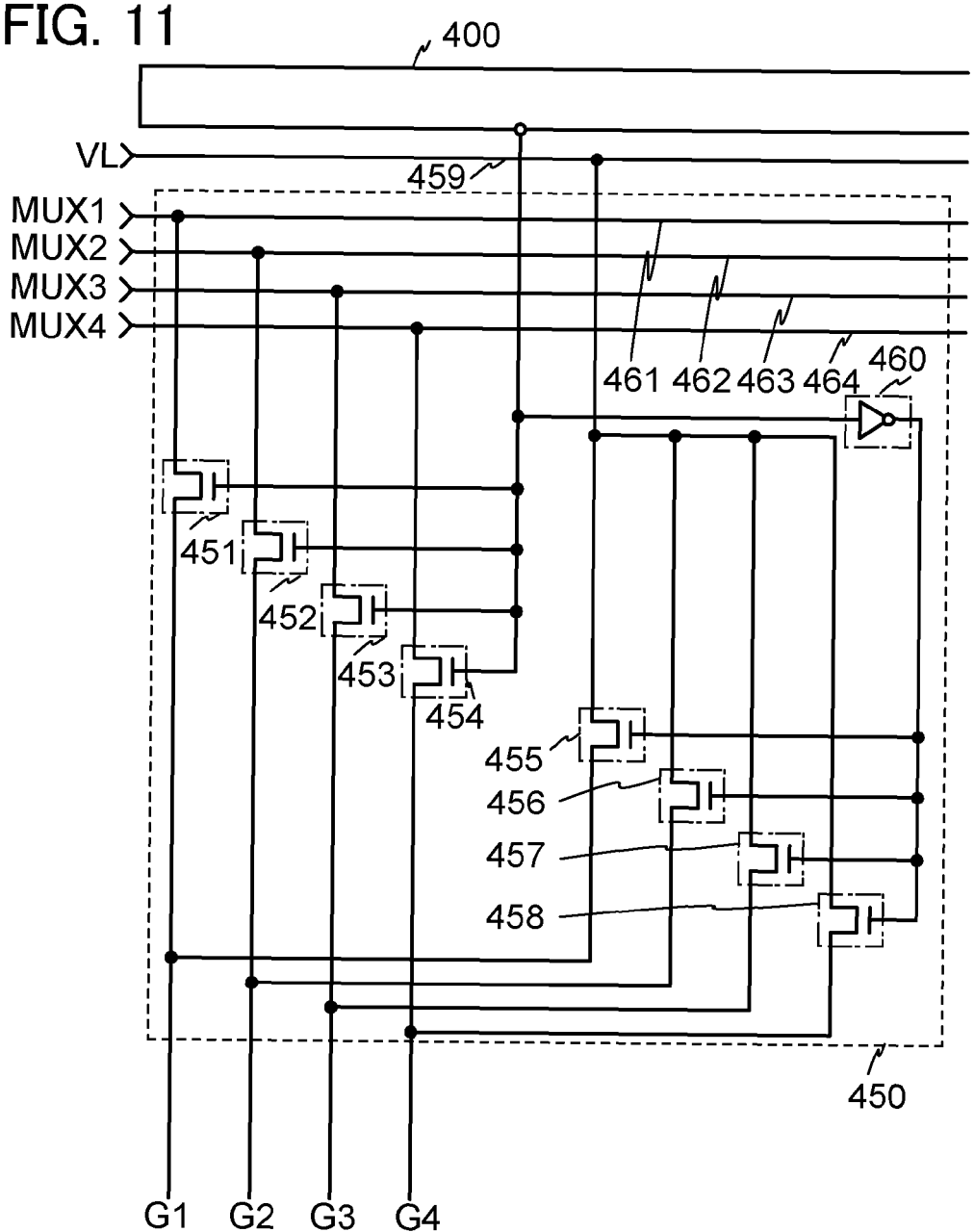
FIG. 11 shows an example of the driver circuit.

In addition, even if an inversion output signal out1B which is an inverted signal of the output signal out1 is used instead of the first inversion control signal MUX1B, the second inversion control signal MUX2B, the third inversion control signal MUX3B, and the fourth inversion control signal MUX4B, the similar output signal can be output through the lines G1 to G4. FIG. 11 shows a circuit configuration as a specific example. Note that a demultiplexer circuit 450 shown in FIG. 11 generates a plurality of signals arising at different timings (four signals here) by using single input signal and a plurality of control signals as in FIG. 5.

Specifically, the demultiplexer circuit 450 includes a line 459 through which the low-level signal VL is supplied to a first transistor 451, a second transistor 452, a third transistor 453, a fourth transistor 454, a fifth transistor 455, a sixth transistor 456, a seventh transistor 457, an eighth transistor 458; and an inverter circuit 460 which outputs the inversion output signal OUT1B, for example. Further, the demultiplexer circuit 450 includes a line 461 through which the first control signal MUX1 is supplied, a line 462 through which the second control signal MUX2 is supplied, a line 463 through which the third control signal MUX3 is supplied, and a line 464 through which the fourth control signal MUX4 is supplied. A first terminal of the first transistor 451 is connected to the line 461, a gate of the first transistor 451 is connected to an output terminal of the driver circuit 400, and a second terminal of the first transistor 451 is connected to the line G1. A first terminal of the second transistor 452 is connected to the line 462, a gate of the second transistor 452 is connected to the output terminal of the driver circuit 400, and a second terminal of the second transistor 452 is connected to the line G2. A first terminal of the third transistor 453 is connected to the line 463, a gate of the third transistor 453 is connected to the output terminal of the driver circuit 400, and a second terminal of the third transistor 453 is connected to the line G3. A first terminal of the fourth transistor 454 is connected to the line 464, a gate of the fourth transistor 454 is connected to the output terminal of the driver circuit 400, and a second terminal of the fourth transistor 454 is connected to the line G4. Further, an input terminal of the inverter circuit 460 is connected to the output terminal of the driver circuit 400. Further, a first terminal of the fifth transistor 455 is connected to the line 459, a gate of the fifth transistor 455 is connected to an output terminal of the inverter circuit 460, and a second terminal of the fifth transistor 455 is connected to the line G1. A first terminal of the sixth transistor 456 is connected to the line 459, a gate of the sixth transistor 456 is connected to an output terminal of the inverter circuit 460, and a second terminal of the sixth transistor 456 is connected to the line G2. A first terminal of the seventh transistor 457 is connected to the line 459, a gate of the seventh transistor 457 is connected to an output terminal of the inverter circuit 460, and a second terminal of the seventh transistor 457 is connected to the line G3. A first terminal of the eighth transistor 458 is connected to the line 459, a gate of the eighth transistor 458 is connected to an output terminal of the inverter circuit 460, and a second terminal of the eighth transistor 458 is connected to the line G4.

Figure 12:
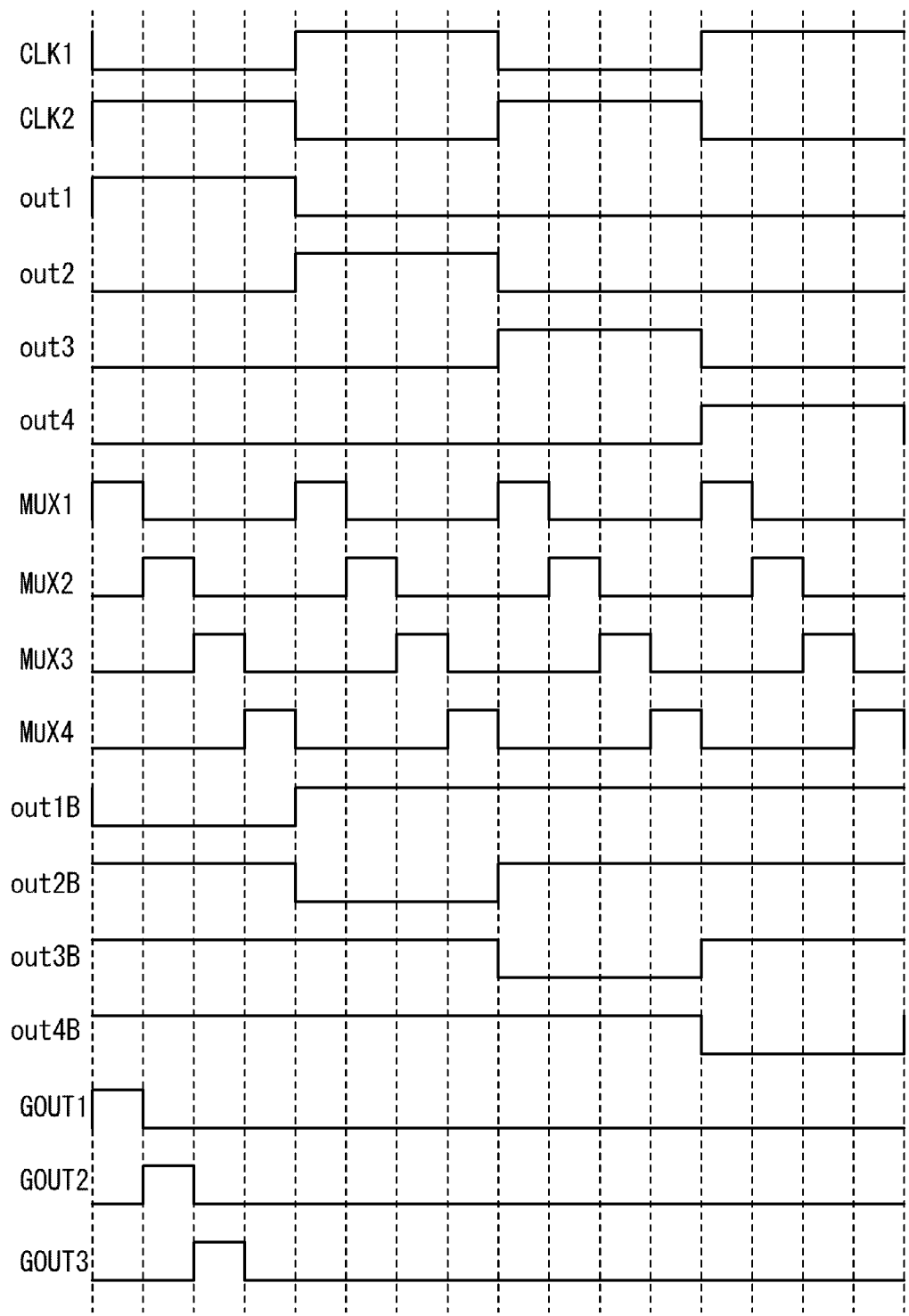
FIG. 12 shows an example of the timing chart of the driver circuit.

A timing chart of the signals shown in FIG. 11 is shown in FIG. 12 according to FIG. 6. FIG. 12 shows that the same output signals as those in FIG. 6 can be obtained.

Note that in the demultiplexer circuit 450 shown in FIG. 11, the first to fourth transistors 451 to 454 are designed to have lower L/W ratio than the fifth to eighth transistors 455 to 458. In other words, the first to fourth transistors 451 to 454 are designed to have higher current supply capability than the fifth to eighth transistors 455 to 458.

Specifically, in the case where a demultiplexer circuit is configured using transistors which have a semiconductor layer of an oxide semiconductor, the fifth to eighth transistors 455 to 458 are preferably designed to have higher capacitance than the first to fourth transistors 451 to 454. In other words, the fifth to eighth transistors 455 to 458 are preferably designed to have higher L/W ratio than the first to fourth transistors 451 to 454. Note that the fifth to eighth transistors 455 to 458 can have a semiconductor layer, a thickness of which is smaller than that of the first to fourth transistors 451 to 454. This configuration is preferable because it can differentiate the above mentioned capacitance. Note that the fifth to eighth transistors 455 to 458 are each called a fourth transistor in some cases, according to the first transistor and the second transistor which are included in an inverter circuit of the driver circuit 400, and the third transistor which is a switch of the driver circuit 400. In addition, the first to fourth transistors 451 to 454 are each called a fifth transistor in some cases, according to the first transistor and the second transistor which are included in an inverter circuit of the driver circuit 400, the third transistor which is a switch of the driver circuit 400, and the fourth transistor.

The number of input signals is reduced by applying the inversion output signal out1B to the demultiplexer circuit 405. Further, space savings can be achieved by a reduction in the area for routing wiring, which reduction is accompanied by a reduction in the number of signals, thereby downsizing the driver circuit and reducing the power consumption.

The configuration according to this embodiment can control on or off of a transistor in a driver circuit, all of the transistors of which are of the same conductivity type, even when the transistor is normally on. Therefore, a driver circuit with higher accuracy and a small malfunction can be provided despite a normally-on transistor in the driver circuit.

This embodiment can be implemented in appropriate combination with the structures described in the other embodiments.

Embodiment 3

In this embodiment, the manufacturing process of the driver circuit described in the above embodiments, specifically a top view and cross-sectional view of the thin film transistor which has a semiconductor layer of an oxide semiconductor will be described. Note that a display device including a driver circuit in this embodiment can be applied to a liquid crystal display device and a display device including a light-emitting element such as an organic EL. The driver circuit described in the above embodiments can be applied to a driver circuit of an electronic paper including an electrophoresis element. Note that the driver circuit described in the above embodiments can be applied to not only a driver circuit of a display device but other devices such as a driver circuit for a photosensor.

Figure 7:
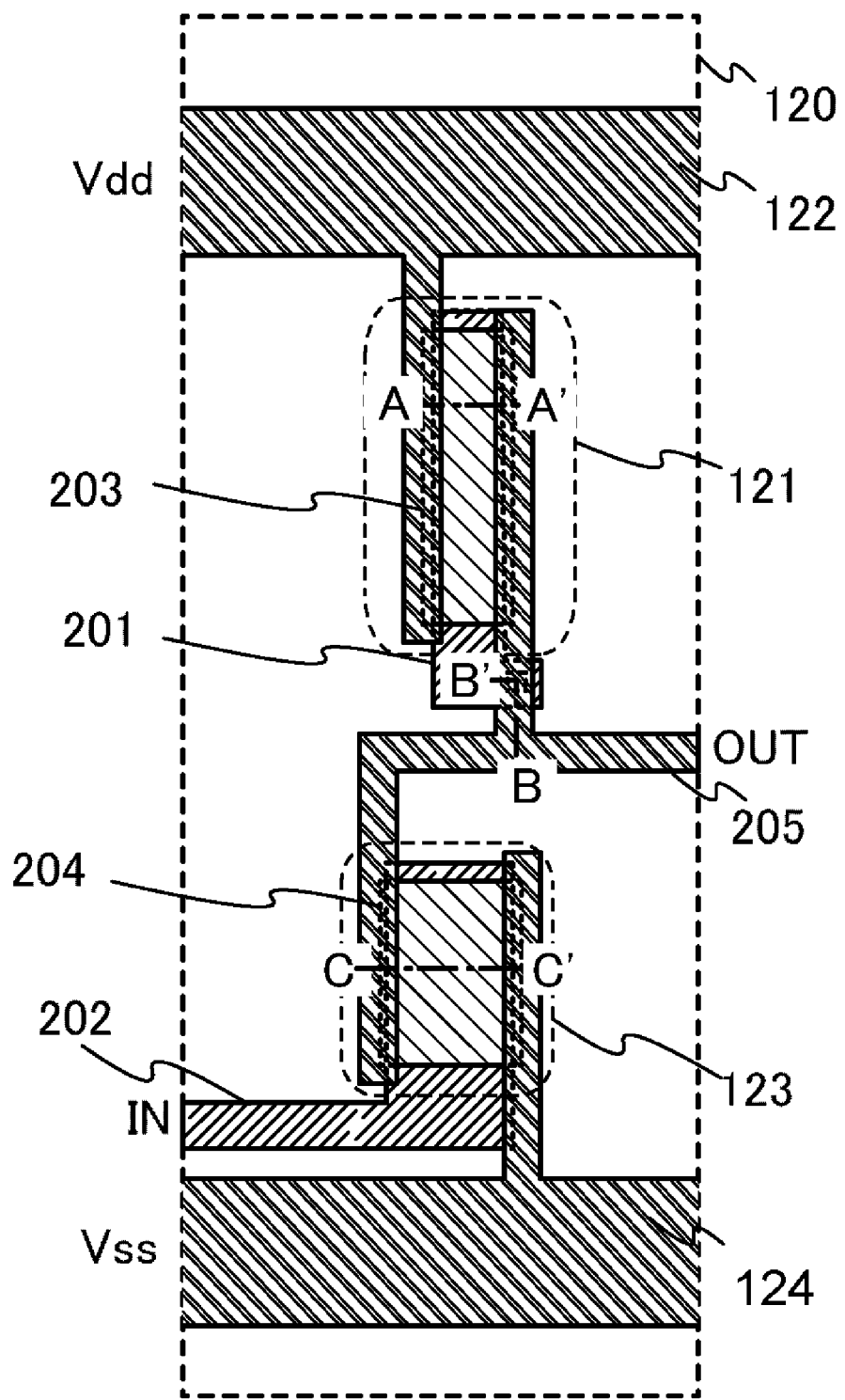
FIG. 7 shows an example of the top view of an inverter circuit.
Figure 8:
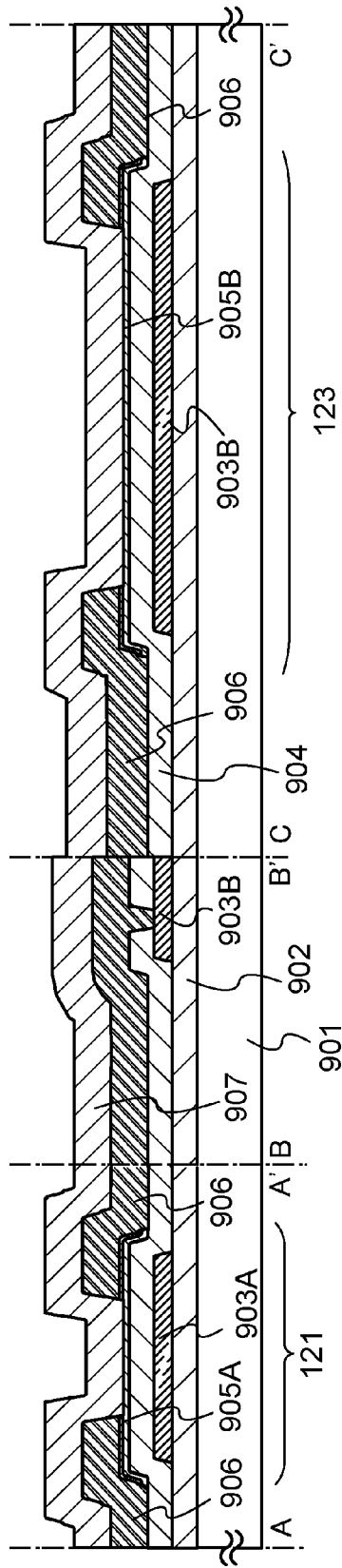
FIG. 8 shows an example of the cross-sectional view of the inverter circuit.

FIG. 7 is a top view of the inverter circuit 120 including the first transistor 121 and the second transistor 123 described in Embodiment 1 with reference to FIG. 3. FIG. 8 is a cross-sectional view of the first transistor 121 and the second transistor 123. In addition, the cross-sectional view of the first transistor 121 and the second transistor 123 corresponds to sections A-A', B-B', and C-C' in the top view of the inverter circuit 120 shown in FIG. 7. Note that in this embodiment, an example of the method of forming a thin film transistor which has a semiconductor layer of an oxide semiconductor, in particular, will be described.

First, a base film 902 is deposited on a substrate 901. Next, a conductive film is formed over the base film 902, and then gate electrode layers 903A and 903B are formed by a photolithography process.

Note that a resist mask can be formed by an inkjet method. A photomask is not used when the resist mask is formed by an inkjet method, which results in reducing manufacturing cost.

Examples of the material for the conductive film used for the gate electrode layers 903A and 903B include an element selected from Al, Cr, Ta, Ti, Mo, and W, an alloy containing any of these elements as its component, and an alloy film containing any of these elements in combination.

In the case where a glass substrate is used as the substrate 901, a glass substrate having a strain point of 730° C. or higher is preferably used if the temperature of heat treatment performed later is high. For the glass substrate, a glass material such as aluminosilicate glass, aluminoborosilicate glass, or barium borosilicate glass is used, for example.

The base film 902 has a function of preventing diffusion of an impurity element from the substrate 901, and can be formed to have a single-layer or multilayer structure of one or more of a silicon nitride film, a silicon oxide film, a silicon nitride oxide film, and a silicon oxynitride film.

Next, a gate insulating layer 904 is formed over the gate electrode layers 903A and 903B.

The gate insulating layer 904 can be formed using a single-layer or multilayer structure of any of a silicon oxide layer, a silicon nitride layer, a silicon oxynitride layer, and a silicon nitride oxide layer by plasma CVD, sputtering, or the like. For example, a silicon oxynitride layer can be formed using a deposition gas containing $SiH_4$, oxygen, and nitrogen by plasma CVD.

Next, the gate insulating layer 904 is selectively etched by a photolithography process, so that a contact hole reaching the gate electrode layer 903B is formed.

Next, an oxide semiconductor film is formed over the gate insulating layer 904. The preferable thickness is 50 nm or less, so that the oxide semiconductor film can have an amorphous structure even when heat treatment for dehydration or dehydrogenation is performed after formation of the oxide semiconductor film.

Any of the following is used as the oxide semiconductor film: an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, an Sn—O-based oxide semiconductor film, and a Zn—O-based oxide semiconductor film. The oxide semiconductor film can be formed by sputtering in a rare gas (typically argon) atmosphere, an oxygen atmosphere, or an atmosphere of a rare gas (typically argon) and oxygen.

Here, deposition is performed using an oxide semiconductor target containing In, Ga, and Zn ($In_2O_3:Ga_2O_3:ZnO=1:1:1$ [mol %], In:Ga:Zn=1:1:0.5 [at %]) under the condition where the distance between the substrate and the target is 100 mm, the pressure is 0.6 Pa, the direct current (DC) power source is 0.5 kW, and the atmosphere is an oxygen atmosphere (of an oxygen flow rate of 100%). Note that a pulse direct current (DC) power source is preferable because it reduces dust and makes the film thickness uniform.

Examples of sputtering include RF sputtering in which a high-frequency power source is used as a sputtering power source, DC sputtering, and pulsed DC sputtering in which a bias is applied in a pulsed manner. RF sputtering is mainly used in the case of forming an insulating film, and DC sputtering is mainly used in the case of forming a metal conductive film.

In addition, there is also a multi-source sputtering apparatus in which a plurality of targets of different materials can be set. The multi-source sputtering apparatus allows a multilayer film of different materials to be deposited in the same chamber, or allows plural kinds of materials to be deposited by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering in which a voltage is also applied to a substrate during deposition.

Note that before the oxide semiconductor film is formed by sputtering, dust on a surface of the gate insulating layer 904 is preferably removed by reverse sputtering in which an argon gas is introduced and plasma is generated. The reverse sputtering refers to a method in which, without application of a voltage to a target side, an RF power source is used for application of voltage to a substrate side in an argon atmosphere and plasma is generated in the vicinity of the substrate to modify a surface. Note that instead of an argon atmosphere, nitrogen, helium, oxygen, or the like may be used.

Next, the oxide semiconductor film is processed into island-shape oxide semiconductor layers 905A and 905B by a photolithography process. In addition, the resist mask for forming the island-shaped oxide semiconductor layers 905A and 905B may be formed by an inkjet method.

Next, the oxide semiconductor layer is subjected to dehydration or dehydrogenation. The temperature of heat treatment for dehydration or dehydrogenation is greater than or equal to 400° C. and less than or equal to 750° C., preferably greater than or equal to 425° C. and less than or equal to the strain point of the substrate. Note that in the case of the temperature that is 425° C. or higher, the heat treatment time may be one hour or shorter, whereas in the case of the temperature lower than 425° C., the heat treatment time is longer than one hour. Here, the substrate is introduced into an electric furnace which is one of heat treatment apparatuses, and the heat treatment of the oxide semiconductor layer is performed in a nitrogen atmosphere. After that, the oxide semiconductor layer is not exposed to air, which prevents the oxide semiconductor layer from including water or hydrogen again; thus, an oxide semiconductor layer is obtained. In this embodiment, one furnace used in the heat treatment is continuously used up to the time when the temperature is lowered from the heat temperature T at which dehydration or dehydrogenation of the oxide semiconductor layer is performed to the temperature enough to prevent reincorporation of water. Specifically, slow cooling is performed in a nitrogen atmosphere up to the time when the temperature becomes less than the heat temperature T by 100° C. or more. The atmosphere in which dehydration or dehydrogenation is performed is not limited to a nitrogen atmosphere; dehydration or dehydrogenation is performed in a rare gas atmosphere (helium, neon, argon, or the like). The degree of crystallinity of an oxide semiconductor becomes 90% or higher or 80% or higher in some heat conditions.

The heat treatment apparatus is not limited to an electric furnace and can be provided with a device that heats an object by thermal conduction or thermal radiation from a heater such as a resistance heater or the like. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with a process object by heat treatment, such as nitrogen or a rare gas such as argon is used.

Next, a conductive film is formed over the gate insulating layer 904 and the oxide semiconductor layers 905A and 905B. After that, a resist mask is formed through a photolithography process and then, the conductive film is selectively etched to form an electrode layer 906. As a material of the conductive film, an element selected from Ti, Mo, W, Al, Cr, Cu, and Ta, an alloy containing any of these elements as a component, an alloy containing these elements in combination, or the like is used. The conductive film is not limited to a single-layer film containing the above element and can be a multi-layer film of two or more layers. Note that in FIG. 8, only the conductive film on and in contact with the oxide semiconductor layer is selectively removed. Therefore, when an ammonia peroxide mixture (hydrogen peroxide: ammonia:water=5:2:2) or the like as an alkaline etchant is used in order to selectively remove only the conductive layer, which is on and in contact with the oxide semiconductor layer, the conductive film can be selectively removed so that the oxide semiconductor layer containing an In—Ga—Zn—O-based oxide semiconductor can be left.

Next, an insulating layer 907 is formed over the gate insulating layer 904, the oxide semiconductor layers 905A and 905B, and the electrode layer 906. The insulating layer 907 can be formed to a thickness of at least 1 nm or more using a method by which an impurity such as water and hydrogen is not included in the oxide insulating film, such as sputtering, as appropriate. As the insulating layer 907 which is formed so as to be in contact with the oxide semiconductor layers 905A and 905B, an inorganic insulating film which does not include an impurity such as moisture, a hydrogen ion, and OH— and blocks entry of these from the outside is used. Specifically, a silicon oxide film, a silicon nitride oxide film, an aluminum oxide film, or an aluminum oxynitride film is used.

Through the above process, the first transistor 121 and the second transistor 123 can be formed.

Note that the first transistor 121 and the second transistor 123 shown in FIG. 8 are bottom-gate TFTs which have a semiconductor layer of an oxide semiconductor. An embodiment of the present invention is, however, not limited to this; the first transistor 121 and the second transistor 123 can be top-gate TFTs.

The configuration according to this embodiment can control on or off of a transistor in a driver circuit even if the transistor is normally on. Therefore, a driver circuit with higher accuracy and a small malfunction can be provided despite a normally-on transistor in the driver circuit.

This embodiment can be implemented in appropriate combination with the structures described in the other embodiments.

Embodiment 4

In this embodiment, an example will be described below in which at least a part of a driver circuit and thin film transistors to be arranged in a pixel area are formed over the same substrate. The thin film transistors to be arranged in the pixel area are formed in a manner similar to those in Embodiment 3.

Figure 9A:
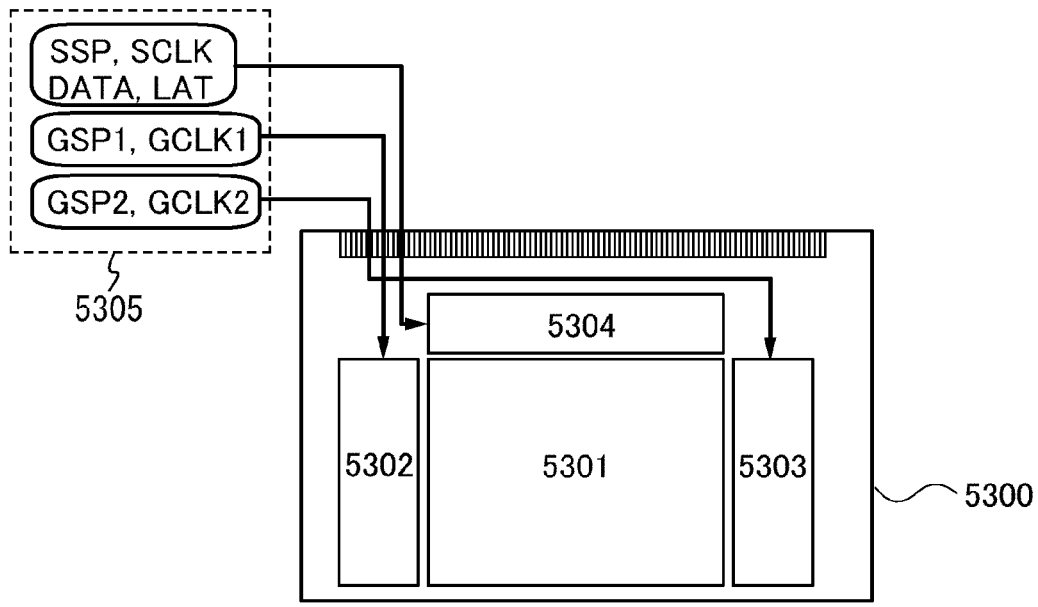
FIGS. 9A and 9B show an example of a display device.

FIG. 9A shows an example of the block diagram of an active matrix display device. Over a substrate 5300 in the display device, a pixel area 5301, a first scan line driver circuit 5302, a second scan line driver circuit 5303, and a signal line driver circuit 5304 are provided. In the pixel area 5301, a plurality of signal lines extended from the signal line driver circuit 5304 is arranged and a plurality of scan lines extended from the first scan line driver circuit 5302 and the second scan line driver circuit 5303 is arranged. Note that pixels which include display elements are provided in a matrix in respective regions where the scan lines and the signal lines intersect with each other. Further, the substrate 5300 in the display device is connected to a timing control circuit 5305 (also referred to as a controller or a controller IC) through a connection portion such as a Flexible Printed Circuit (FPC).

In FIG. 9A, the first scan line driver circuit 5302, the second scan line driver circuit 5303, and the signal line driver circuit 5304 are formed over the substrate 5300 over which the pixel area 5301 is formed. Thus, the number of components of a driver circuit and the like which is provided outside are reduced, so that a reduction in cost can be achieved. Further, if the driver circuit is provided outside the substrate 5300, wiring would need to be extended and the number of wiring connections would be increased, but if the driver circuit is provided over the substrate 5300, the number of wiring connections can be reduced. Consequently, improvement in reliability and yield can be achieved.

Note that the timing control circuit 5305 supplies, for example, a first scan line driver circuit start signal (GSP1) and a scan line driver circuit clock signal (GCLK1) to the first scan line driver circuit 5302. Moreover, the timing control circuit 5305 supplies, for example, a second scan line driver circuit start signal (GSP2) (which is also referred to as a start pulse) and a scan line driver circuit clock signal (GCLK2) to the second scan line driver circuit 5303. The timing control circuit 5305 supplies a signal line driver circuit start signal (SSP), a signal line driver circuit clock signal (SCLK), a video signal data (DATA) (also simply referred to as a video signal), and a latch signal (LAT) to the signal line driver circuit 5304. Note that each clock signal can be a plurality of clock signals with different cycles or can be supplied together with a signal (CLKB) obtained by inverting the clock signal. Note that it is possible to omit one of the first scan line driver circuit 5302 and the second scan line driver circuit 5303.

Figure 9B:
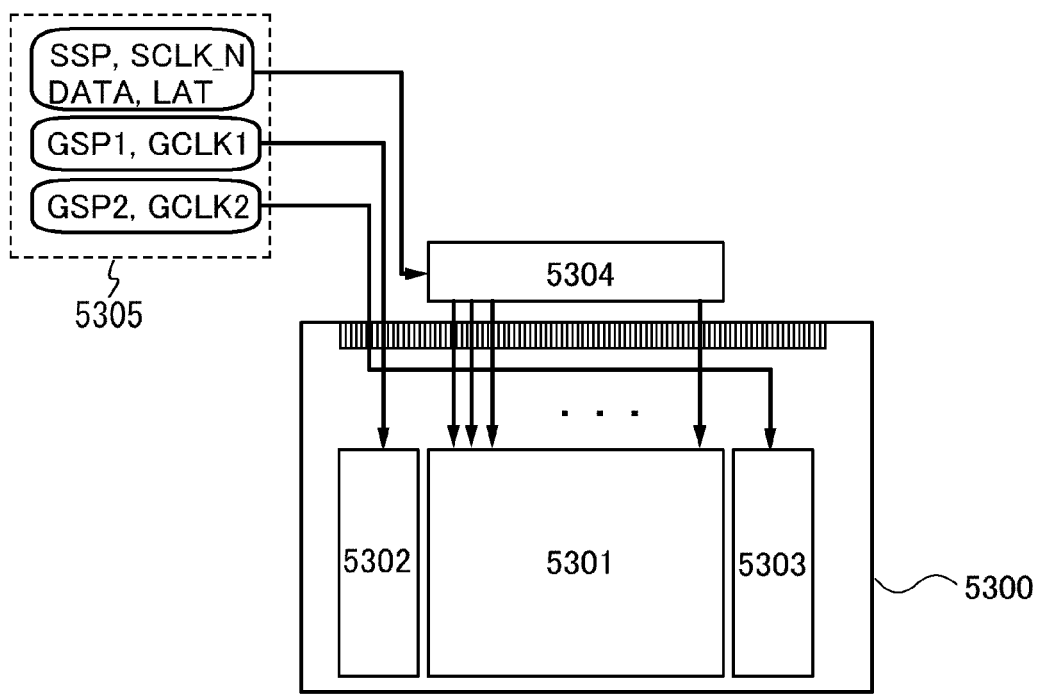

FIG. 9B shows a structure in which circuits with low driving frequency (e.g., the first scan line driver circuit 5302 and the second scan driver circuit 5303) are formed over the substrate 5300 over which the pixel area 5301, and the signal line driver circuit 5304 is formed over a substrate which is different from a substrate over which the pixel area 5301 is formed. With this structure, a driver circuit formed over the substrate 5300 can be constituted by using thin film transistors with lower field-effect mobility as compared to that of a transistor formed using a single crystal semiconductor. Thus, an increase in the size of the display device, a reduction in the number of steps, a reduction in cost, an improvement in yield, or the like can be achieved.

This embodiment can be implemented in appropriate combination with the structures described in the other embodiments.

Embodiment 5

In this embodiment, examples of electronic apparatuses whose display portion is provided with the display device shown in the above embodiments will be described.

The contents (or part of the contents) described in each drawing of the above embodiments can be applied to various electronic devices, specifically to a display portion of an electronic device. Examples of such electronic device include a video camera, a digital camera, a goggle-type display, a navigation system, an audio reproducing device (e.g., a car audio component or an audio component), a computer, a game machine, a personal digital assistant (e.g., a mobile computer, a mobile phone, a portable game console, or an e-book reader), and an image reproducing device provided with a recording medium (specifically, a device which reproduces a recording medium such as a digital versatile disc (DVD) and has a display for displaying a reproduced image).

Figure 10A:
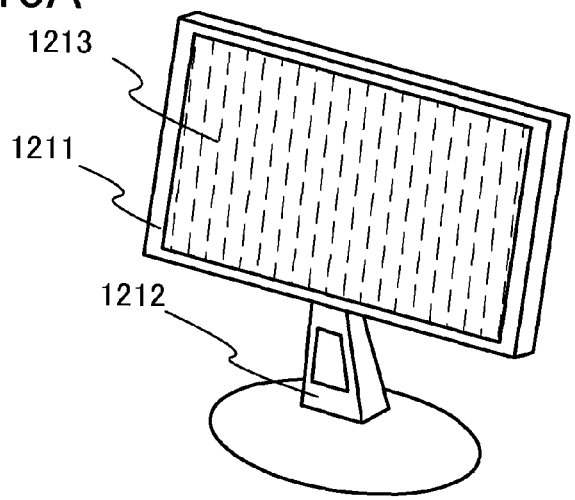
FIGS. 10A to 10C each show an example of an electronic appliance.

FIG. 10A shows a display device which includes a housing 1211, a support 1212, and a display portion 1213. The display device shown in FIG. 10A has a function of displaying a variety of information (e.g., still images, moving images, and text images) on the display portion. Note that the function that the display device shown in FIG. 10A has is not limited to this; the display device shown in FIG. 10A can have various functions.

Figure 10B:
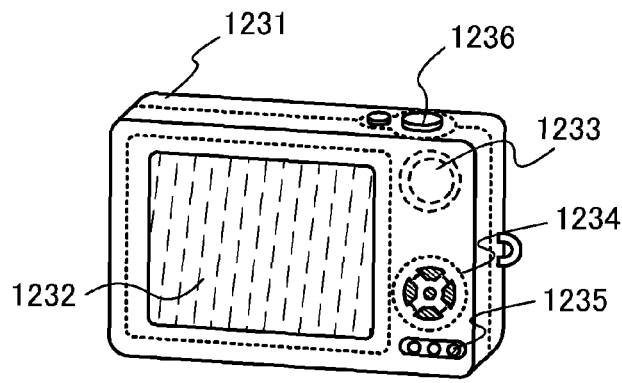

FIG. 10B shows a camera which includes a main body 1231, a display portion 1232, an image receiving portion 1233, operation keys 1234, an external connection port 1235, and a shutter button 1236. The camera shown in FIG. 10B has a function of taking still images and a function of taking moving images. Note that the camera illustrated in FIG. 10B is not limited to having these functions. Note that the functions of the camera shown in FIG. 10B are not limited to these functions; the camera can have various functions.

Figure 10C:
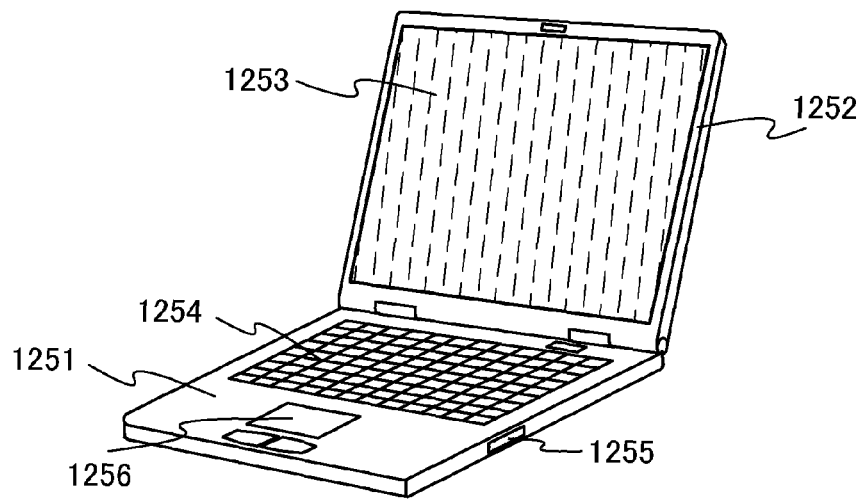

FIG. 10C shows a computer which includes a main body 1251, a housing 1252, a display portion 1253, a keyboard 1254, an external connection port 1255, and a pointing device 1256. The computer shown in FIG. 10C has a function of displaying various kinds of information (e.g., still images, moving images, and text images) on the display portion. Note that the functions of the computer illustrated in FIG. 10C are not limited to these functions; the computer can have various functions.

Applying the display device described in the above embodiments to the display portion of this embodiment allows the transistor in the driver circuit shown in FIGS. 10A to 10C to be turned on or off even if the transistor is normally on. Thus, a driver circuit with higher accuracy and a small malfunction can be provided despite a normally-on transistor in the driver circuit. In addition, it is possible to reduce the power consumption by reducing the frequency of clock signals of the driver circuit.

This embodiment can be combined with any of the other embodiments as appropriate.

This application is based on Japanese Patent Application serial no. 2009-219066 filed with Japan Patent Office on Sep. 24, 2009, the entire contents of which are hereby incorporated by reference.

EXPLANATION OF REFERENCE

100: driver circuit, 101: line, 102: line, 103: pulse output circuit, 104: line, 111: first switch, 112: first inverter circuit, 113: second inverter circuit, 114: second switch, 115: third switch, 116: third inverter circuit, 117: fourth inverter circuit, 118: fourth switch, 120: inverter circuit, 121: first transistor, 122: line, 123: second transistor, 124: line, 130: inverter circuit, 131: first transistor, 132: second transistor, 140: transistor, 141: wave form, 142: wave form, 143: wave form, 144: wave form, 145: wave form, 201: gate line, 202: gate line, 203: semiconductor layer, 204: semiconductor layer, 205: line, 400: driver circuit, 401: line, 402: line, 403: pulse output circuit, 404: line, 405: demultiplexer circuit, 406: line, 501: first transistor, 502: second transistor, 503: third transistor, 504: fourth transistor, 505: fifth transistor, 506: sixth transistor, 507: seventh transistor, 508: eighth transistor, 509: ninth transistor, 510: tenth transistor, 511: eleventh transistor, 512: twelfth transistor, 513: thirteenth transistor, 514: fourteenth transistor, 515: line, 516: line, 517: line, 518: line, 901: substrate, 902: base film, 904: gate insulating layer, 906: electrode layer, 907: insulating layer, 1211: housing, 1212: support, 1213: display portion, 1231: main body, 1232: display portion, 1233: image receiver, 1234: control key, 1235: external connection port, 1236: shutter button, 1251: main body, 1252: housing, 1253: display portion, 1254: keyboard, 1255: external connection port, 1256: pointing device, 5300: substrate, 5301: pixel area, 5302: scan line driver circuit, 5303: scan line driver circuit, 5304: signal line driver circuit, 5305: timing control circuit, 903A: gate electrode layer, 903B: gate electrode layer, 905A: oxide semiconductor layer, 450: demultiplexer circuit, 451: first transistor, 452: second transistor, 453: third transistor, 454: fourth transistor, 455: fifth transistor, 456: sixth transistor, 457: seventh transistor, 458: eighth transistor, 459: line, 460: inverter circuit, 461: line, 462: line, 463: line, 464: line

What is claimed is:

1. A driver circuit comprising:
a shift register comprising an inverter circuit and a switch,
wherein the inverter circuit comprises a first transistor and a second transistor,
wherein the switch comprises a third transistor,
wherein the first to third transistors each comprise an oxide semiconductor layer and are depletion-mode transistors, and
wherein an amplitude voltage of clock signals for driving the third transistor is higher than a power supply voltage for driving the inverter circuit.

2. The driver circuit according to claim 1,
wherein the clock signals are a first clock signal and a second clock signal, and
wherein the second clock signal is an inverted signal of the first clock signal.

3. The driver circuit according to claim 1, wherein an L/W ratio of the first transistor is higher than an L/W ratio of the second transistor.

4. The driver circuit according to claim 1, wherein a film thickness of a semiconductor layer of the first transistor is larger than a film thickness of a semiconductor layer of the second transistor.

5. The driver circuit according to claim 1, wherein the first to third transistor are n-channel transistors.

6. A display device comprising the driver circuit according to claim 1.

7. An electronic appliance comprising the display device according to claim 6.

8. The driver circuit according to claim 1, wherein the shift register is a static shift register.

9. A driver circuit comprising:
a shift register comprising an inverter circuit and a switch; and
a demultiplexer circuit connected to an output terminal of the shift register,
wherein the inverter circuit comprises a first transistor and a second transistor,
wherein the switch comprises a third transistor,
wherein the first to third transistors each comprise an oxide semiconductor layer and are depletion-mode transistors,
wherein an amplitude voltage of clock signals for driving the third transistor is higher than a power supply voltage for driving the inverter circuit, and
wherein output terminals of the demultiplexer circuit are each connected to a fourth transistor for holding a potential of the output terminal.

10. The driver circuit according to claim 9,
wherein the clock signals are a first clock signal and a second clock signal, and
wherein the second clock signal is an inverted signal of the first clock signal.

11. The driver circuit according to claim 9, wherein an L/W ratio of the first transistor is higher than an L/W ratio of the second transistor.

12. The driver circuit according to claim 9, wherein a film thickness of a semiconductor layer of the first transistor is larger than a film thickness of a semiconductor layer of the second transistor.

13. The driver circuit according to claim 9, wherein an L/W ratio of a fifth transistor in the demultiplexer circuit is lower than an L/W ratio of the fourth transistor.

14. The driver circuit according to claim 9,
wherein a gate of the fourth transistor is electrically connected to a line through which a positive power supply voltage is supplied,
wherein a first terminal of the fourth transistor is electrically connected to a line through which a negative power supply voltage is supplied, and
wherein a second terminal of the fourth transistor is electrically connected to an output terminal of the demultiplexer circuit.

15. The driver circuit according to claim 9, wherein the first to fourth transistor are n-channel transistors.

16. A display device comprising the driver circuit according to claim 9.

17. An electronic appliance comprising the display device according to claim 16.

18. The driver circuit according to claim 9, wherein the shift register is a static shift register.

19. A method for driving a driver circuit, the driver circuit including a shift register comprising an inverter circuit and a switch,
wherein the inverter circuit comprises a first transistor and a second transistor,
wherein the switch comprises a third transistor, and
wherein the first to third transistors each comprise an oxide semiconductor layer and are depletion-mode transistors, said method comprising the step of:
inputting clock signals to the switch,
wherein an amplitude voltage of the clock signals for driving the third transistor is higher than a power supply voltage for driving the inverter circuit.

20. The driver circuit according to claim 19,
wherein the clock signals are a first clock signal and a second clock signal, and
wherein the second clock signal is an inverted signal of the first clock signal.

21. The driver circuit according to claim 19, wherein an L/W ratio of the first transistor is higher than an L/W ratio of the second transistor.

22. The driver circuit according to claim 19, wherein a film thickness of a semiconductor layer of the first transistor is larger than a film thickness of a semiconductor layer of the second transistor.

23. The driver circuit according to claim 19, wherein the first to third transistor are n-channel transistors.

24. A display device comprising the driver circuit according to claim 19.

25. An electronic appliance comprising the display device according to claim 24.

26. The driver circuit according to claim 19, wherein the shift register is a static shift register.

* * * * *

UNITED STATES PATENT AND TRADEMARK OFFICE
CERTIFICATE OF CORRECTION

PATENT NO. : 8,363,778 B2
APPLICATION NO. : 13/552986
DATED : January 29, 2013
INVENTOR(S) : Jun Koyama et al.

It is certified that error appears in the above-identified patent and that said Letters Patent is hereby corrected as shown below:

In the Specifications:

At column 3, line 59, "1 nMO$_3$" should be --InMO$_3$--;

At column 4, line 3, "1 nMP$_3$" should be --InMO$_3$--;

At column 4, line 5, "1 nMP$_3$" should be --InMO$_3$--.

Signed and Sealed this
Twenty-first Day of May, 2013

Teresa Stanek Rea
*Acting Director of the United States Patent and Trademark Office*